(12) United States Patent
Dysard et al.

(10) Patent No.: US 7,897,061 B2
(45) Date of Patent: Mar. 1, 2011

(54) COMPOSITIONS AND METHODS FOR CMP OF PHASE CHANGE ALLOYS

(75) Inventors: Jeffrey Dysard, St. Charles, IL (US); Paul Feeney, Aurora, IL (US); Sriram Anjur, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 86 days.

(21) Appl. No.: 11/699,129

(22) Filed: Jan. 29, 2007

(65) Prior Publication Data

US 2007/0178700 A1    Aug. 2, 2007

Related U.S. Application Data

(60) Provisional application No. 60/764,161, filed on Feb. 1, 2006.

(51) Int. Cl.
*C09K 13/00* (2006.01)

(52) U.S. Cl. ........ 252/79.1; 252/79.5; 438/693; 216/106

(58) Field of Classification Search ................. 252/79.1, 252/79.2, 79.3, 79.4, 79.5; 438/691, 692, 438/693; 216/89, 106
See application file for complete search history.

(56) References Cited

U.S. PATENT DOCUMENTS

| | | | |
|---|---|---|---|
| 6,744,088 B1 * | 6/2004 | Dennison | 257/296 |
| 7,250,369 B1 * | 7/2007 | Uchida et al. | 438/692 |
| 7,367,870 B2 * | 5/2008 | Kurata et al. | 451/36 |
| 2003/0102457 A1 * | 6/2003 | Miller | 252/79.1 |
| 2006/0000151 A1 * | 1/2006 | Kelley et al. | 51/298 |

FOREIGN PATENT DOCUMENTS

| | | | |
|---|---|---|---|
| CN | 1616572 | * | 5/2005 |
| CN | 1632023 | * | 6/2005 |
| DE | 142830 | * | 7/1980 |
| DE | 148914 | * | 6/1981 |
| EP | 1 150 341 | | 10/2001 |
| JP | 59-196385 | * | 11/1984 |
| JP | 07-161669 | * | 6/1995 |
| SU | 1059033 | * | 12/1983 |
| WO | WO 2004/055916 | | 7/2004 |

* cited by examiner

*Primary Examiner* — Lan Vinh
(74) *Attorney, Agent, or Firm* — Thomas E. Omholt; Robert J. Ross; Steven D. Weseman

(57) ABSTRACT

The present invention provides a chemical-mechanical polishing (CMP) composition suitable for polishing a substrate comprising a phase change alloy (PCA), such as a germanium-antimony-tellurium (GST) alloy. The composition comprises not more than about 6 percent by weight of a particulate abrasive material in combination with an optional oxidizing agent, at least one chelating agent, and an aqueous carrier therefor. The chelating agent comprises a compound or combination of compounds capable of chelating a phase change alloy or component thereof (e.g., germanium, indium, antimony and/or tellurium species) that is present in the substrate, or chelating a substance that is formed from the PCA during polishing of the substrate with the CMP composition. A CMP method for polishing a phase change alloy-containing substrate utilizing the composition is also disclosed.

6 Claims, 1 Drawing Sheet

COMPOSITIONS AND METHODS FOR CMP OF PHASE CHANGE ALLOYS

CROSS-REFERENCE TO RELATED APPLICATIONS

This application claims the benefit of U.S. Provisional Application for Patent Ser. No. 60/764,161, filed on Feb. 1, 2006, which is incorporated herein by reference.

FIELD OF THE INVENTION

This invention relates to polishing compositions and methods for polishing a substrate using the same. More particularly, this invention relates to chemical-mechanical polishing compositions suitable for polishing substrates comprising a phase change alloy, such as a germanium-antimony-tellurium alloy.

BACKGROUND OF THE INVENTION

Typical solid state memory devices (dynamic random access memory (DRAM), static random access memory (SRAM), erasable programmable read only memory (EPROM), and electrically erasable programmable read only memory (EEPROM)) employ micro-electronic circuit elements for each memory bit in memory applications. Since one or more electronic circuit elements are required for each memory bit, these devices consume considerable chip space to store information, limiting chip density. For typical non-volatile memory elements (like EEPROM i.e. "flash" memory), floating gate field effect transistors are employed as the data storage device. These devices hold a charge on the gate of the field effect transistor to store each memory bit and have limited re-programmability. They are also slow to program.

PRAM (Phase Change Access Memory) devices (also known as Ovonic memory devices) use phase change materials (PCMs) that can be electrically switched between an insulating amorphous and conductive crystalline state for electronic memory application. Typical materials suited for these applications utilize various chalcogenide (Group VIB) and Group VB elements of the periodic table (e.g., Te, Po, and Sb) in combination with one or more of In, Ge, Ga, Sn, or Ag (sometimes referred to herein as a "phase change alloy"). Particularly useful phase change alloys are germanium (Ge)-antimony (Sb)-tellurium (Te) alloys (GST alloys), such as an alloy having the formula $Ge_2Sb_2Te_5$. These materials can reversibly change physical states depending on heating/cooling rates, temperatures, and times. Other useful alloys include indium antimonite (InSb). The memory information in PRAM is preserved with minimal loss through the conductive properties of the different physical states.

Compositions and methods for chemical-mechanical polishing (CMP) the surface of a substrate are well known in the art. Polishing compositions (also known as polishing slurries, CMP slurries, and CMP compositions) for CMP of metal-containing surfaces of semiconductor substrates (e.g., integrated circuits) typically contain an oxidizing agent, various additive compounds, abrasives, and the like.

In conventional CMP techniques, a substrate carrier or polishing head is mounted on a carrier assembly and positioned in contact with a polishing pad in a CMP apparatus. The carrier assembly provides a controllable pressure to the substrate, urging the substrate against the polishing pad. The pad and carrier, with its attached substrate, are moved relative to one another. The relative movement of the pad and substrate serves to abrade the surface of the substrate to remove a portion of the material from the substrate surface, thereby polishing the substrate. The polishing of the substrate surface typically is further aided by the chemical activity of the polishing composition (e.g., by oxidizing agents present in the CMP composition) and/or the mechanical activity of an abrasive suspended in the polishing composition. Typical abrasive materials include silicon dioxide, cerium oxide, aluminum oxide, zirconium oxide, and tin oxide.

U.S. Pat. No. 5,527,423 to Neville, et al., for example, describes a method for chemically-mechanically polishing a metal layer by contacting the surface of the metal layer with a polishing slurry comprising high purity fine metal oxide particles suspended in an aqueous medium. Alternatively, the abrasive material may be incorporated into the polishing pad. U.S. Pat. No. 5,489,233 to Cook et al. discloses the use of polishing pads having a surface texture or pattern, and U.S. Pat. No. 5,958,794 to Bruxvoort et al. discloses a fixed abrasive polishing pad.

CMP techniques can be utilized to manufacture memory devices employing phase change materials; however, current CMP compositions do not provide sufficient for planarity when utilized for polishing substrates including relatively soft phase change alloys, such as a GST or InSb alloy. In particular, the physical properties of many phase change alloys (e.g., GST or InSb) alloys make them "soft" relative to other materials utilized in PCM chips. For example, typical CMP polishing slurries containing relatively high solid concentrations (> about 3%) remove a phase change alloy (e.g., a GST alloy) through the mechanical action of the abrasive particles resulting in heavy scratching on the surface of the phase change alloy. When such high solids CMP compositions are used, phase change alloy residues often remain on the underlying dielectric film after polishing, since the CMP slurry is not able to remove all of the phase change alloy material. The phase change alloy residues cause further integration issues in subsequent steps of device manufacturing.

There is an ongoing need to develop new CMP compositions that exhibit reduced scratching and residue defects, while still providing acceptably rapid removal of phase change alloys compared to conventional CMP compositions. The present invention provides such improved CMP compositions. These and other advantages of the invention, as well as additional inventive features, will be apparent from the description of the invention provided herein

BRIEF SUMMARY OF THE INVENTION

The present invention provides a chemical-mechanical polishing (CMP) composition suitable for polishing phase change alloy (PCA)-containing materials. The CMP composition comprises a particulate abrasive material in combination with at least one chelating agent, an optional oxidizing agent, and an aqueous carrier therefor. The abrasive material is present in an amount of not more than about 6 percent by weight. The chelating agent comprises a compound or combination of compounds capable of chelating a PCA material or component thereof (e.g., germanium, indium, antimony and/or tellurium species) that is present in a substrate being polished, or chelating a substance (e.g., an oxidation product) that is formed from the PCA material during polishing of the substrate with the CMP composition.

The present invention also provides a method of polishing a surface of a substrate comprising a PCA with a CMP composition of the invention. The method comprises the steps of contacting a surface of a PCA-containing substrate with a polishing pad and an aqueous CMP composition, and causing relative motion between the polishing pad and the substrate, while maintaining a portion of the CMP composition in contact with the surface between the pad and the substrate. The relative motion is maintained for a period of time sufficient to abrade at least a portion of the PCA from the substrate. The CMP composition comprises not more than about 6 percent by weight of a particulate abrasive material in combination with at least one chelating agent, an optional oxidizing agent, and an aqueous carrier therefor. The chelating agent comprises a compound or combination of compounds capable of chelating a phase change alloy or component thereof (e.g., germanium, indium, antimony and/or tellurium species) that is present in a substrate, or chelating a substance that is formed from the PCA material during polishing of the substrate with the CMP composition.

DETAILED DESCRIPTION OF THE INVENTION

Figure 1:
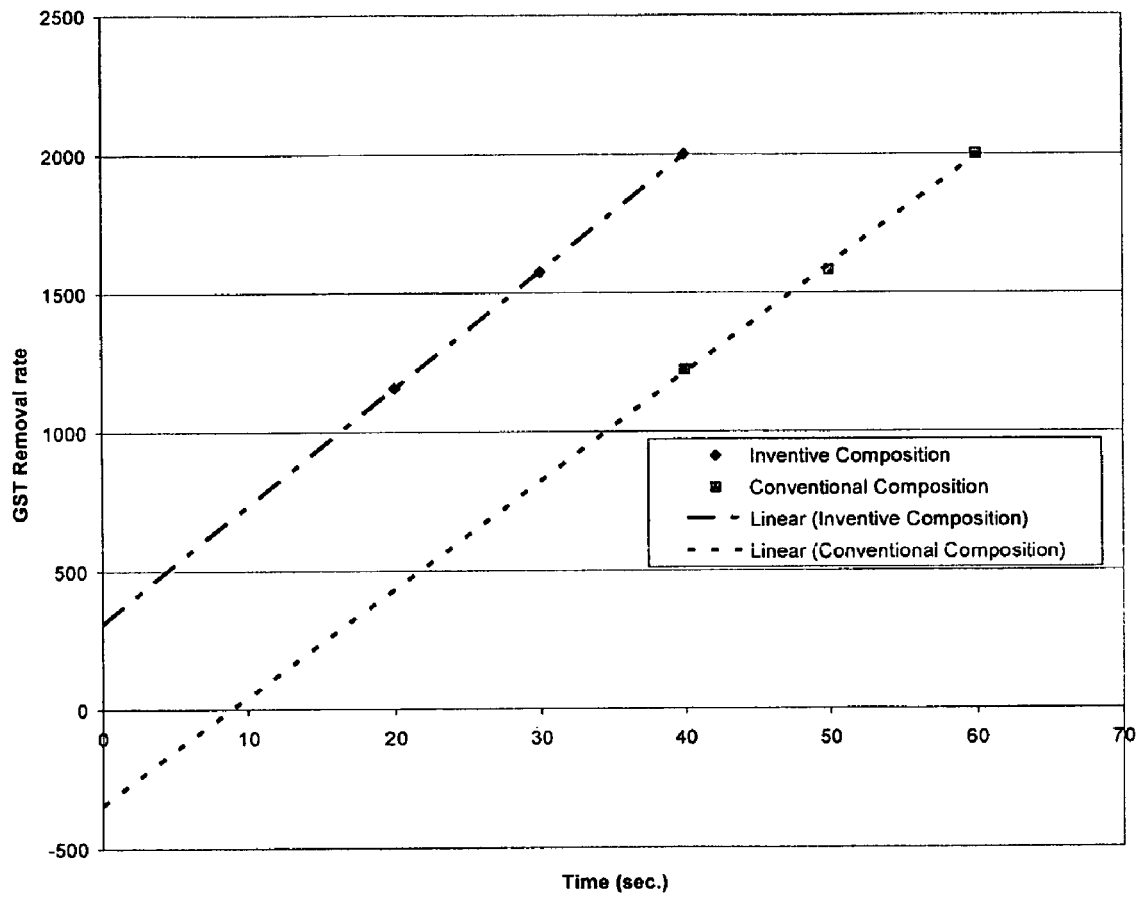
FIG. 1 shows a plot of GST removal rate versus polishing duration for a CMP composition of the invention compared to a conventional CMP composition.

The present invention provides a CMP composition useful for polishing a substrate containing a phase change alloy (PCA). The CMP compositions of the invention provide for even removal of a PCA with reduced defectivity relative to conventional CMP compositions. The CMP compositions contain a particulate abrasive material and a chelating agent that is capable of chelating a PCA material or component thereof (e.g., germanium, indium, antimony and/or tellurium species) present in the substrate being polished or a substance formed from the PCA material during the polishing process (e.g., an oxidation product formed from the PCA material). In some preferred embodiments, the composition also comprises an oxidizing agent.

The particulate abrasive materials useful in the CMP compositions of the invention include any abrasive material suitable for use in CMP of semiconductor materials. Examples of suitable abrasive materials include, without limitation silica, alumina, titania, ceria, zirconia, or a combination of two or more of the foregoing abrasives, which are well known in the CMP art. Preferred metal oxide abrasives include colloidal silica, fumed silica, and alpha-alumina. The abrasive material is present in the composition in an amount of not more than about 6 percent by weight. Preferably, the abrasive material is present in the CMP composition in an amount in the range of about 0.001 to about 6 percent by weight, more preferably in the range of about 0.01 to about 5 percent by weight, most preferably in the range of about 0.1 to about 1 percent by weight. The abrasive particles preferably have a mean particle size in the range of about 5 nm to about 150 nm, more preferably about 70 nm to about 110 nm, as determined by laser light scattering techniques, which are well known in the art.

The abrasive desirably is suspended in the CMP composition, more specifically in the aqueous component of the CMP composition. When the abrasive is suspended in the CMP composition, the abrasive preferably is colloidally stable. The term colloid refers to the suspension of abrasive particles in the liquid carrier. Colloidal stability refers to the maintenance of that suspension over time. In the context of this invention, an abrasive is considered colloidally stable if, when the abrasive is placed into a 100 mL graduated cylinder and allowed to stand without agitation for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., $([B]-[T])/[C] \leq 0.5$). The value of $([B]-[T])/[C]$ desirably is less than or equal to 0.3, and preferably is less than or equal to 0.1.

Oxidizing agents suitable for use in the CMP compositions and methods of the present invention include, without limitation hydrogen peroxide, persulfate salts (e.g., ammonium monopersulfate, ammonium dipersulfate, potassium monopersulfate, and potassium dipersulfate), periodate salts (e.g., potassium periodate), salts thereof, and a combination of two or more of the foregoing. Preferably, the oxidizing agent is present in the composition in an amount in the range of about 0.1 to about 6 percent by weight, more preferably about 2 to about 4 percent by weight.

The CMP compositions of the invention preferably have a pH in the range of about 2 to about 11, more preferably about 2 to about 5, most preferably about 2 to about 4. The CMP compositions can optionally comprise one or more pH buffering materials, for example, ammonium acetate, disodium citrate, and the like. Many such pH buffering materials are well known in the art.

The CMP compositions of the invention also comprise at least one chelating agent capable of chelating a PCA material or a component thereof (e.g., germanium, indium, antimony, and/or tellurium species) present in the substrate being polished or chelating a substance formed therefrom during the CMP process. Examples of suitable chelating agents include, without limitation dicarboxylic acids (e.g., oxalic acid, malonic acid, succinic acid, maleic acid, phthalic acid, tartaric acid, aspartic acid, glutamic acid, and the like), polycarboxylic acids (e.g., citric acid, 1,2,3,4-butane tetracarboxylic acid, polyacrylic acid, polymaleic acid, and the like), aminocarboxylic acids (e.g., alpha-amino acids, beta amino acids, omega-amino acids, and the like), phosphates, polyphosphates, amino phosphonates, phosphonocarboxylic acids, polymeric chelating agents capable of chelating phase change alloy materials or particles, salts thereof, combinations of two or more of the foregoing, and the like. Preferred chelating agents include oxalic acid, malonic acid, succinic acid, citric acid, salts thereof, and combinations of two or more of the foregoing. More preferably, the chelating agent is selected from the group consisting of oxalic acid, malonic acid, salts thereof, and a combination thereof.

The CMP compositions of the invention can be prepared by any suitable technique, many of which are known to those skilled in the art. The CMP composition can be prepared in a batch or continuous process. Generally, the CMP composition can be prepared by combining the components thereof in any order. The term "component" as used herein includes individual ingredients (e.g., abrasives, chelating agents, acids, bases, oxidizing agents, and the like), as well as any combination of ingredients. For example, an abrasive can be dispersed in water, and the chelating agent can be added, and mixed by any method that is capable of incorporating the components into the CMP composition. The oxidizing agent, when present, can be added to the composition at any suitable time. In some embodiments, the oxidizing agent is not added to the CMP composition until the composition is ready for use in a CMP process, for example, the oxidizing agent is added just prior to initiation of polishing. The pH can be adjusted at any suitable time.

The CMP compositions of the present invention also can be provided as a concentrate, which is intended to be diluted with an appropriate amount of water prior to use. In such an embodiment, the CMP composition concentrate can include the various components dispersed or dissolved in aqueous solvent in amounts such that, upon dilution of the concentrate with an appropriate amount of aqueous solvent, each component of the polishing composition will be present in the CMP composition in an amount within the appropriate range for use.

The invention also provides a method of chemically-mechanically polishing a substrate that includes a PCA material. The method comprises (i) contacting a surface of a substrate with a polishing pad and a CMP composition of the invention as described herein, and (ii) moving the polishing pad relative to the surface of the substrate with the polishing composition therebetween, thereby abrading at least a portion of a PCA from the substrate to polish the surface thereof.

The CMP methods of the present invention can be used to polish any suitable substrate, and is especially useful for polishing substrates comprising a GST alloy, InSb, and the like. Preferably, the PCA is a GST alloy (e.g., $Ge_2Sb_2Te_5$) or InSb. Preferably, the substrate also includes a liner material such as Ti or TiN, as well as a layer of silicon dioxide thereunder. In a preferred method, a PCA material and a liner layer are abraded, and the abrading is stopped at a silicon dioxide layer.

The CMP methods of the present invention are particularly suited for use in conjunction with a chemical-mechanical polishing apparatus. Typically, the CMP apparatus comprises a platen, which, when in use, is in motion and has a velocity that results from orbital, linear, and/or circular motion, a polishing pad in contact with the platen and moving with the platen when in motion, and a carrier that holds a substrate to be polished in contact with the pad and moving relative to the surface of the polishing pad. A CMP composition is typically pumped onto the polishing pad to aid in the polishing process. The polishing of the substrate is accomplished by the combined abrasive action of the moving polishing pad and the CMP composition of the invention present on the polishing pad, which abrades at least a portion of the surface of the substrate, and thereby polishes the surface.

A substrate can be planarized or polished with a CMP composition of the invention using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353 to Sandhu et al., U.S. Pat. No. 5,433,651 to Lustig et al., U.S. Pat. No. 5,949,927 to Tang, and U.S. Pat. No. 5,964,643 to Birang et al. Desirably, the inspection or monitoring of the progress of the polishing process with respect to a workpiece being polished enables the determination of the polishing end-point, i.e., the determination of when to terminate the polishing process with respect to a particular workpiece.

The following examples further illustrate the invention but, of course, should not be construed as in any way limiting its scope.

Example 1

This example illustrates the performance of a conventional CMP composition for removal of a GST film from a substrate, compared to a composition of the invention.

Wafers having a GST film surface (200 mm TEOS wafers having 2000 Å thickness of a $Ge_2Sb_2Te_5$ film on the surface thereof) were polished on an IPEC 472 polisher having an IC1000 polishing pad, with a platen speed of about 90 rpm, a carrier speed of about 87 rpm, a down pressure of about 3 psi, and a slurry flow rate of 200 mL/minute. The conventional CMP compositions evaluated had the formulations shown in Table 1, along with the GST removal rates obtained therefrom. Removal of GST by conventional CMP composition (0.5 percent by weight fumed silica and about 3 percent by weight hydrogen peroxide) was uneven, particularly when close to clearing (i.e., removal of the whole layer) and resulted in a scratched GST surface after removal of about 1000 Å. In contrast, a CMP composition of the invention (Example 1D) afforded a relatively scratch-free and even removal of GST, even at clearing.

TABLE 1

CMP Slurry Formulations.

| Example # | Formulation | GST Removal Rate |
|---|---|---|
| 1A | 10% colloidal silica (20 nm), 1% $H_2O_2$, pH 3 | 1101 Å/min |
| 1B | 10% colloidal silica (80 nm), 1% $H_2O_2$, pH 3 | 2459 Å/min |
| 1C | 10% fumed silica, 1% $H_2O_2$, pH 3 | 4000 Å/min |
| 1D | 5% fumed silica, 3% $H_2O_2$, pH 2.3 | 3523 Å/min |

Example 2

This example illustrates the ability of CMP compositions containing a chelating agent to effectively remove a GST film.

Wafers having a GST film surface (200 mm TEOS wafers having 2000 Å thickness of a $Ge_2Sb_2Te_5$ film on the surface thereof) were polished on a Mirra polisher having an IC1010 polishing pad, with a platen speed of about 90 rpm, a carrier speed of about 87 rpm, a down pressure of about 3 psi, and a slurry flow rate of 200 mL/minute. The CMP compositions evaluated included either about 1 percent by weight malonic acid or about 1 percent by weight succinic acid as the chelating agent, about three percent by weight of hydrogen peroxide, and either 1 percent by weight or 3 percent by weight of colloidal silica having an average particle size of about 70 nm, in water at pH 3. The results (GST removal rates) are shown in Table 2. All of the formulations provided relatively even and scratch-free removal of GST.

TABLE 2

CMP Formulations Including a Chelating Agent.

| Example # | Formulation | GST Removal Rate |
|---|---|---|
| 2A | 1% malonic acid, 1% silica, 3% $H_2O_2$ | >2000 Å/min |
| 2B | 1% malonic acid, 3% silica, 3% $H_2O_2$ | 2950 Å/min |
| 2C | 1% succinic acid, 1% silica, 3% $H_2O_2$ | 790 Å/min |
| 2D | 1% succinic-acid, 3% silica, 3% $H_2O_2$ | 900 Å/min |

Example 3

This example illustrates the ability of CMP compositions of the invention containing a chelating agent, an oxidizing agent, and an abrasive in an amount of not more than about 3 percent by weight to effectively remove a GST film.

Wafers having a GST film surface (200 mm TEOS wafers having 2000 Å thickness of a $Ge_2Sb_2Te_5$ film on the surface thereof) were polished on an IPEC 472 polisher having an IC1000 polishing pad, with a platen speed of about 90 rpm, a carrier speed of about 87 rpm, a down pressure of about 3 psi, and a slurry flow rate of 200 mL/minute. The CMP compositions evaluated included either about 1 percent by weight malonic acid or about 1 percent by weight oxalic acid as the chelating agent, about three percent by weight of hydrogen peroxide, and either 1 percent by weight or 0.2 percent by weight of colloidal silica having an average particle size of about 20 nm or 80 nm, in water at pH 3. The results (GST removal rates) are shown in Table 3. An examination of the wafers after polishing indicated that the scratching and residue problems associated with the use of conventional CMP compositions was eliminated when a chelating agent was present. The results in Table 3 indicate that chelating agents greatly aided in removal of GST, providing GST removal rates of around 1000 Å/min or greater, while utilizing relatively low abrasive levels to reduce scratching of the GST surface.

Removing the oxidizing agent from the formulations containing 1 percent by weight malonic acid and 80 nm colloidal silica at 0.2 percent by weight, 0.6 percent by weight and 1 percent by weight, resulted in a significant decrease in the GST removal rate. These results indicate that the oxidizing agent in the CMP compositions of the invention significantly promotes removal of GST due to its chemical activity.

TABLE 3

CMP formulations Including a Chelating Agent.

| Example # | Formulation | GST Removal Rate |
|---|---|---|
| 3A | 1% malonic acid, 0.2% silica, 20 nm, 3% $H_2O_2$ | 980 Å/min |
| 3B | 1% malonic acid, 0.2% silica, 80 nm, 3% $H_2O_2$ | 870 Å/min |
| 3C | 1% malonic acid, 1% silica, 20 nm, 3% $H_2O_2$ | 1250 Å/min |
| 3D | 1% malonic acid, 1% silica, 80 nm, 3% $H_2O_2$ | 2280 Å/min |
| 3E | 1% oxalic acid, 0.2% silica, 20 nm, 3% $H_2O_2$ | 860 Å/min |
| 3F | 1% oxalic acid, 0.2% silica, 80 nm, 3% $H_2O_2$ | 830 Å/min |
| 3G | 1% oxalic acid, 1% silica, 20 nm, 3% $H_2O_2$ | 1270 Å/min |
| 3H | 1% oxalic acid, 1% silica, 80 nm, 3% $H_2O_2$ | 2620 Å/min |

Example 4

This example illustrates the time dependence of GST removal using the CMP compositions of the invention, compared to a conventional CMP slurry that does not include a chelating agent.

Wafers having a GST film surface (200 mm TEOS wafers having 2000 Å thickness of a $Ge_2Sb_2Te_5$ film on the surface thereof) were polished on a Mirra polisher having an IC1010 polishing pad, with a platen speed of about 90 rpm, a carrier speed of about 87 rpm, a down pressure of about 3 psi, and a slurry flow rate of 200 mL/minute. The CMP compositions evaluated included a conventional CMP slurry, which contained about 0.5 percent by weight fumed silica and about 3 percent by weight hydrogen peroxide, compared to a CMP composition of the invention containing about 1 percent by weight of 80 nm colloidal silica, about 3 percent by weight hydrogen peroxide, and about 1 percent by weight malonic acid in water at pH 3. The results, plotted as amount of GST removed versus time of polishing (in seconds) are shown in FIG. 1, and indicate that the conventional CMP slurry exhibited an initiation time before removal of GST began, indicating an important mechanical component in the removal mechanism. In contrast, the CMP composition of the invention exhibited a "static" removal rate, indicating an enhancement in chemical effects in the removal mechanism.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A chemical-mechanical polishing (CMP) composition for polishing a phase change alloy-containing substrate, the composition consisting essentially of:
    (a) a particulate abrasive material in an amount in the range of about 0.01 to about 5 percent by weight and a mean particle size in the range of about 70 nm to about 110 nm;
    (b) at least one chelating agent selected from the group consisting of oxalic acid, malonic acid, succinic acid, citric acid, and a salt thereof;
    (c) an oxidizing agent; and
    (d) an aqueous carrier therefore, wherein the composition has pH of about 2 to about 4.

2. The CMP composition of claim 1 wherein the particulate abrasive material is present in an amount in the range of about 0.1 to about 1 percent by weight.

3. The CMP composition of claim 1 wherein the particulate abrasive material is selected from the group consisting of colloidal silica, fumed silica, and alpha-alumina.

4. The CMP composition of claim 1 wherein the oxidizing agent comprises at least one oxidizing agent selected from the group consisting of a hydrogen peroxide, a persulfate salt, a periodate salt, and a salt thereof.

5. The CMP composition of claim 1 wherein the oxidizing agent comprises hydrogen peroxide.

6. The CMP composition of claim 1 wherein the oxidizing agent is present in an amount in the range of about 0.1 to about 6 percent by weight.

* * * * *